United States Patent
Aubin et al.

(10) Patent No.: US 7,358,822 B2
(45) Date of Patent: Apr. 15, 2008

(54) MEMS OSCILLATOR DRIVE

(75) Inventors: Keith Aubin, Freeville, NY (US); Bojan (Rob) Ilic, Ithaca, NY (US); Maxim Zalalutdinov, Silver Spring, MD (US); Robert B. Reichenbach, Ithaca, NY (US); Jeevak M. Parpia, Ithaca, NY (US); Harold G. Craighead, Ithaca, NY (US)

(73) Assignee: Cornell Research Foundation, Inc., Ithaca, NY (US)

(*) Notice: Subject to any disclaimer, the term of this patent is extended or adjusted under 35 U.S.C. 154(b) by 109 days.

(21) Appl. No.: 11/275,653

(22) Filed: Jan. 20, 2006

(65) Prior Publication Data

US 2006/0176122 A1 Aug. 10, 2006

Related U.S. Application Data

(60) Provisional application No. 60/646,178, filed on Jan. 21, 2005.

(51) Int. Cl.
*H03L 1/00* (2006.01)
(52) U.S. Cl. .................... 331/116 M; 331/176
(58) Field of Classification Search ............ 331/116 M, 331/176
See application file for complete search history.

(56) References Cited

U.S. PATENT DOCUMENTS 6,140,200 A * 10/2000 Eldridge .................... 438/396

OTHER PUBLICATIONS

"European Search Report for corresponding European Application No. EP 06 10 0719", (May 8, 2006), 1 pg.
Bouwstra, S., et al., "Base Driven Micromechanical Resonators", *IEEE Solid-State Sensor and Actuator Workshop, 5th Technical Digest*, (1992),148-152.
Bouwstra, S., et al., "Thermal Base Drive for Micromechanical Resonators Employing Deep-Diffusion Bases", *Sensors and Actuators—A Physical*, A37-A38, (Jun. 1, 1993),38-44.
Ilic, B., et al., "Optical Excitation of Nanoelectromechanical Oscillators", *Applied Physics Letters*, 86(19), (May 6, 2005), 193114-1-193114-3.
Touchscreens.com, "Surface Acoustic Wave Touchscreens", http://www.touchscreens.com/intro-touchtypes-saw.html, (2004),Web Page.
White, N M., "A Thick-Film Acoustic Wave Sensor", http://www.ecs.soton.ac.uk/publications/rj/1994/transduc/white/white.html, (1994),Web Page.

* cited by examiner

*Primary Examiner*—Joseph Chang
(74) *Attorney, Agent, or Firm*—Schwegman, Lundberg & Woessner, P.A.

(57) ABSTRACT

The temperature of a remote portion of device having a microelectromechanical oscillator is modulated to create oscillation of the oscillators. In one embodiment, a localized heat source is placed on a device layer of a multilayered stack, consisting of device, sacrificial and substrate layers. The localized heat source may be a laser beam in one embodiment. The oscillator is supported by the device layer and may be formed in the device layer in various embodiments. The oscillator may be spaced apart from the localized heat source.

20 Claims, 5 Drawing Sheets

| Material | $k$ | $c_P$ | $\rho$ | $E$ | $\alpha$ | $\nu$ |
|---|---|---|---|---|---|---|
| | $W/mK$ | $J/kgK$ | $kg/m^3$ | $GPa$ | $\times 10^{-6} 1/{}^0C$ | |
| Si | 150 | 700 | 2300 | 169 | 2.6 | 0.28 |
| $Si_3N_4$ | 15 | 700 | 3000 | 290 | 3.3 | 0.27 |
| $SiO_2$ | 1.4 | 1000 | 2200 | 70 | 0.5 | 0.17 |
FIG. 4
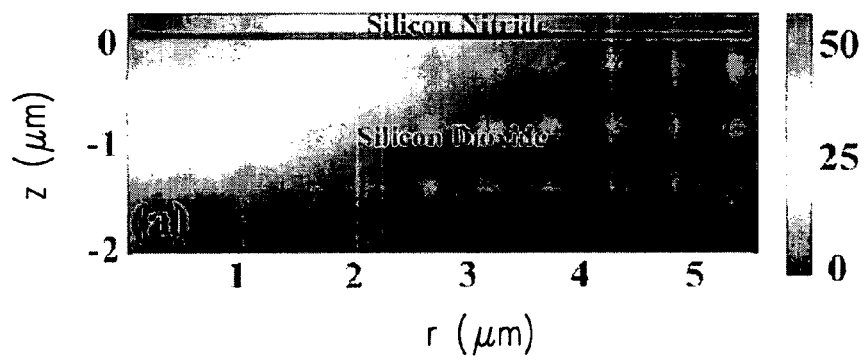
FIG. 5A
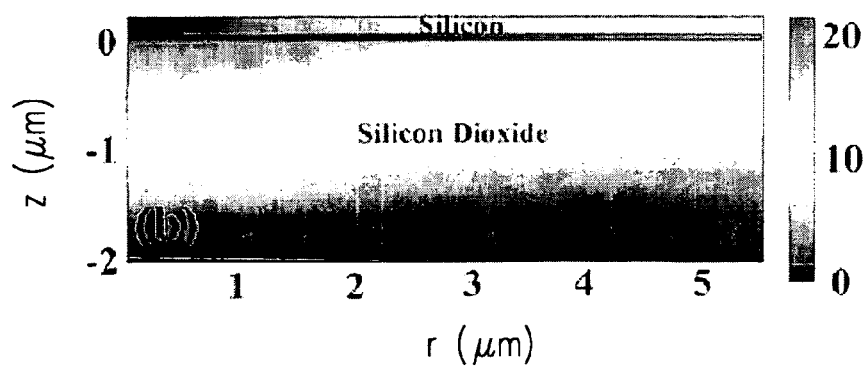
FIG. 5B

MEMS OSCILLATOR DRIVE

RELATED APPLICATIONS

This application claims priority to U.S. Provisional Application Ser. No. 60/646,178 (entitled ACCOUSTIC WAVE MEMS OSCILLATORS DRIVE, filed Jan. 21, 2005) which is incorporated herein by reference.

BACKGROUND

Prior small scale oscillators have been directly driven by sources that are close to, if not on the oscillators themselves. Thus, there can be significant electrical cross talk between the actuation and detection mechanisms. Furthermore, each device requires a separate actuator. Often times, the actuator must be integrated into the device itself at the expense of reduced mechanical behavior.

SUMMARY

The temperature of a remote portion of device having a microelectromechanical oscillator is modulated to create oscillation of the oscillators. In one embodiment, a localized heat source is placed on a device layer of a multilayered stack, consisting of device, sacrificial and substrate layers. The localized heat source may be a laser beam in one embodiment. The oscillator may be formed in the device layer in various embodiments. The oscillator may be spaced apart from the localized heat source.

BRIEF DESCRIPTION OF THE DRAWINGS

FIG. 4 is a table illustrating material properties used in calculations.

FIG. 5A illustrates steady state temperature distribution for a silicon nitride device layer.

FIG. 5B illustrates steady state temperature distribution for a single crystal silicon device layer.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1A:
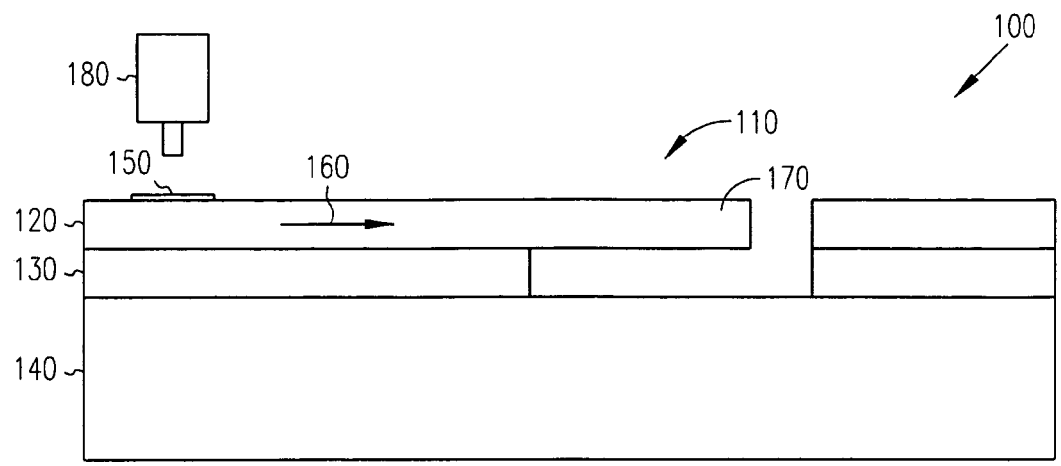
FIG. 1A is a block elevation diagram of an electromechanical oscillator according to an example embodiment.

In FIG. 1A, a device 100 has a micro/nanoelectromechanical (MEMS/NEMS) resonator 110 which may be fabricated using a multilayered stack consisting of device layer 120, sacrificial layer 130 and substrate layer 140. The term, MEMS or microelectromechanical is used to encompass both micro and nanoelectromechanical, or even smaller devices. A localized heat source 150 is placed on the device layer 120. The localized heat source is a laser beam, a heat producing resistor, or other means of transferring heat to a localized region of the device layer 120. The localized heat source provides the ability to modulate temperature, and therefore, stress at a source by controlling the heat provided by the source.

In one embodiment, modulation of the stress, causes stress waves, represented by arrow 160 to propagate from the source of the heat in the form of surface and bulk acoustic traveling waves, thus, transferring energy. This occurs more so with short duration, high energy heating. The traveling waves encounter the micro/nanomechanical resonator 110 and the transferred energy causes the resonator 110 to move in response to the waves. If the waves are at a frequency that matches a natural frequency of vibration of the resonator 110, it undergoes resonant motion. This method allows the drive mechanism, represented by localized heat source 150, of the resonator 110 to be located relatively far from it, hence eliminating losses associated with other actuation methods. The method also allows the ability to drive a singly clamped structure, such as a cantilever 170. The frequency range of the method may operate with resonators with frequencies up to and beyond 450 MHz. Resonators may include cantilever, doubly clamped beam, plate, paddle, and dome geometries.

Heat sources may be fairly close to the resonator or up to and beyond 150 micrometers away. The distance may be used to provide a thermal isolation zone such that resonator oscillation is not adversely affected by the heat. The ability to transmit the traveling waves over distances also provides the ability to cause oscillation of multiple resonators, such as an array of resonators with a single heat source. Multiple heat sources providing the same frequency or different frequencies of traveling waves may also be used. Such sources may cooperate or interfere in certain areas to create many different actuation environments.

Figure 1B:
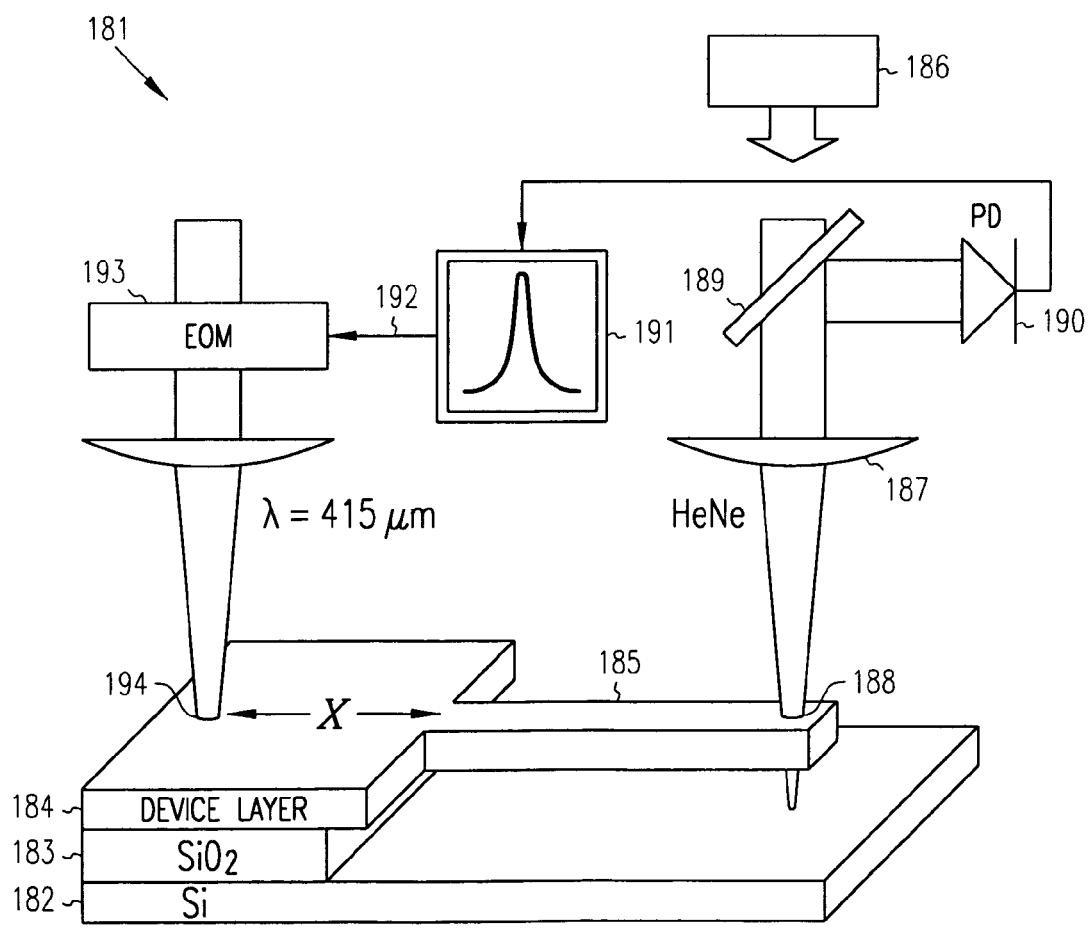
FIG. 1B is a block perspective diagram of an electromechanical oscillator according to an example embodiment, showing driving and detection mechanism.

A further embodiment of an oscillator device is shown at 181 in perspective schematic form in FIG. 1B. A silicon substrate 182 has a silicon dioxide layer ($SiO_2$) 183 formed thereon. This is commonly referred to as a silicon on insulator (SOI) substrate or wafer. In one embodiment, the $SiO_2$ layer is approximately 2 um thick. A device layer 184 is formed of a 140 nm thick single crystal silicon layer. In a further embodiment, the device layer 184 comprises silicon nitride, $Si_3N_4$, which may be fabricated from a low-stress silicon nitride deposited using low-pressure chemical vapor deposition on thermally oxidized (100) silicon wafers.

Micromachined devices, such as a cantilever 185 are then defined from the device layer using electron beam or photo lithography. Devices may be formed with dimensions of varying length (l) from 4 μm to 15 μm, width (w) of 1 μm and thickness (h) of 140 nm. Other dimensions may also be used. Following device definition, the device layer 184 may be etched using CF4 (carbon tetrafluoride) plasma chemistry. Hydrofluoric acid may then be used to etch away the exposed silicon dioxide layer 183, thereby releasing the cantilevers.

Signal transduction may be accomplished in a vacuum by employing an optical interferometric system to measure out of plane mechanical vibrations. Reflectance variations from an incident HeNe laser 186 focused by a lens 187 at a free end 188 of the cantilever beams through a beam splitter 199 may be measured using a single cell photodetector (PD) 190. A spectrum analyzer may 191 be used to collect an output signal from PD 190 and apply a driving signal 192 to modulate a 415 nm diode laser used to excite the oscillator by providing a localized heat source 194 that is remote from the cantilever. An electro-optic modulator (EOM) 193 may be used if a gas laser is used to provide the localized heat source 194. EOM 193 is not necessary for a diode laser, whose intensity can be directly modulated. The localized heat source is shown as remote form the cantilever a distance of X.

In one embodiment, the $SiO_2$ layer is referred to as a sacrificial layer that extends to an edge where the device layer and cantilever are released. The sacrificial layer can extend to the edge of the device layer where the cantilever is clamped as well.

In one embodiment, the device layer and the sacrificial layers have relative high and low thermal conductivities, resulting in induced radial heat flux from the heat sources. The heat is conducted to the edge of the cantilever, where the sacrificial layer ends. Partial deformation appears to take place at the edge of the sacrificial layer, causing actuation of the released cantilever. This type of driving mechanism appears to occur with a laser heating source of low energy, such as approximately 102 uW, and long periods of sinusoidal excitation, such as approximately 50 to 300 ns. With such types of excitation energies, the driving mechanism appears to be primarily thermal in nature, while acoustic wave related phenomena are minor.

While two different combinations of materials, Si—$SiO_2$ and $Si_3N_4$—$SiO_2$, for the device and sacrificial layers have been shown, many other combinations of materials may be used that provide suitable deformations and driving of a cantilever or other oscillating structure. Also, the dimensions may also be varied significantly from the dimensions provided for the embodiments described. Frequencies of excitation and the types and powers of lasers used to provide heating and measuring may also be varied. Measurable amplitudes of vibrations can be obtained at temperature changes much less than one degree.

Figure 2:
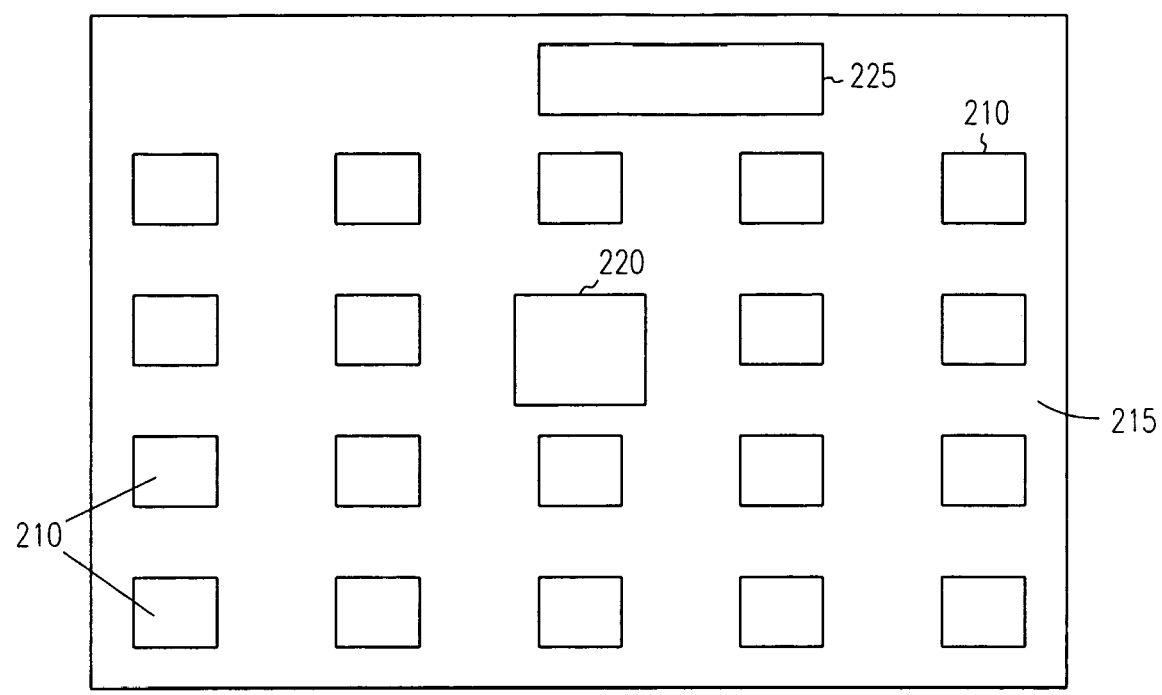
FIG. 2 is a block top view of an array of electromechanical oscillators according to an example embodiment.

In FIG. 2, multiple oscillators 210 are shown supported by a substrate 215. An acoustic wave source 220 is also supported by substrate 215 and is used to create acoustic waves to cause oscillation of the oscillators 210. In one embodiment, the oscillators are equidistant from source 220 such that the oscillators resonate synchronously. In further embodiments, the oscillators need not be at the same distance. Circuitry 225 may also be formed in or supported by the substrate. The circuitry may be in the form of conductors to transport signals to and from the oscillators, and may include detection circuitry, such as optical, capacitive or piezoresistive circuitry.

In one embodiment, the device layer may be a layer in which the MEMs devices are formed or supported, or any other layer which is coupled to a MEMs device that provide a mechanism for heating to cause oscillation of the MEMs device. The MEMs may simply be supported by the device layer. In further embodiments, the acoustic waves may be generated in a structure coupled to the device layer, which then serves to propagate heat to actuate the MEMs device. The term "device layer" is not meant to require the MEMs device and heat source to be co-located in any specific layer. In one embodiment, the heat source and MEMs are both in or on the same layer.

In one embodiment, the driving mechanism is an acoustic wave. Acoustic waves are a disturbance or variation that transfers energy progressively from point to point in a medium. It may take the form of an elastic deformation or of a variation of pressure. The term NEMs is meant to be included in the use of the term MEMs. Other sizes of oscillator may also benefit from the use of acoustic waves as an actuating energy source. Generally, the smaller the oscillator, the higher the resonant frequency.

Figure 3A:
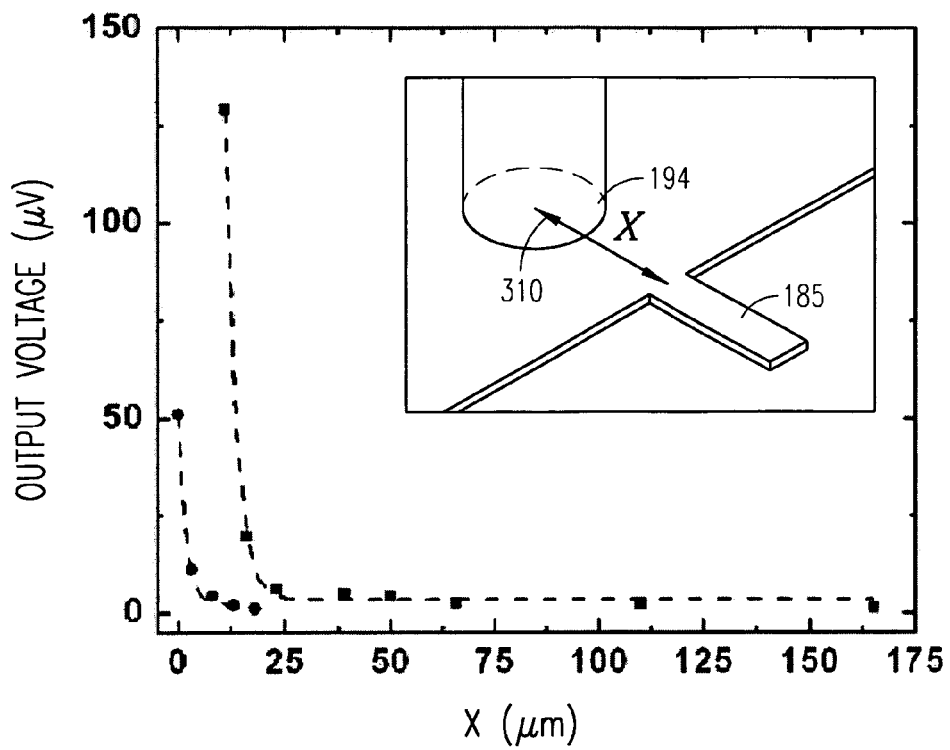
FIG. 3A is a graph illustrating the dependence of the response amplitude on the distance between the thermal source and clamped end of a beam.

Representative data of an optically driven cantilever 181 is shown in FIG. 3A. The squares represent data for a single crystal silicon device layer, and the circles represent data for silicon nitride device layer. The dashed lines represent first order exponential fits. The data demonstrates a substantial effect of the output response with the position of the diode laser. The observed response of the silicon nitride devices was significantly lower and extended to smaller distances, X, between a laser spot 310 and the cantilever 185 in contrast to single crystal silicon devices. The dependence of the near field response was found to be first order exponential strongly suggesting that the primary excitation mechanism is thermal. This dependence is consistent with the exponential character of the temperature distribution in a homogeneous half space heated by a laser beam with total power $P_0$ and Gaussian energy density distribution $q(r, t) = 2P_0 (\pi r_0^2)^{-1} \exp(-2r^2 r_0^{-2}) F(t)$. For example, in the case of a pulse $F(t)=\delta(t)$ $$T(r, t) = \frac{1}{\sqrt{\pi}} \left( \frac{p_0}{\pi r_0 \kappa t} \right) \frac{\hat{r}_0}{2+\hat{r}_0^2} \exp\left( -\hat{z}^2 - 2\frac{\hat{r}^2}{2+\hat{r}_0^2} \right) \quad (1)$$

where $\hat{r}$ and $\hat{z}$ are non-dimensional distances from the excitation source along the surface and in depth direction respectively, $\hat{r}_0$ is the beam waist radius, t is the time, ρ is the density, κ is thermal conductivity, c is the specific heat and $\delta(t)$ is Dirac's delta function. All dimensions are normalized to the diffusion length $(4\kappa t)^{1/2}(\pi c)^{-1/2}$. Eq. (1) coincides with the nonstationary Green's function for a half space in the case when the source radius is much less than diffusion length $\hat{r}_0 \ll 1$.

Figure 3B:
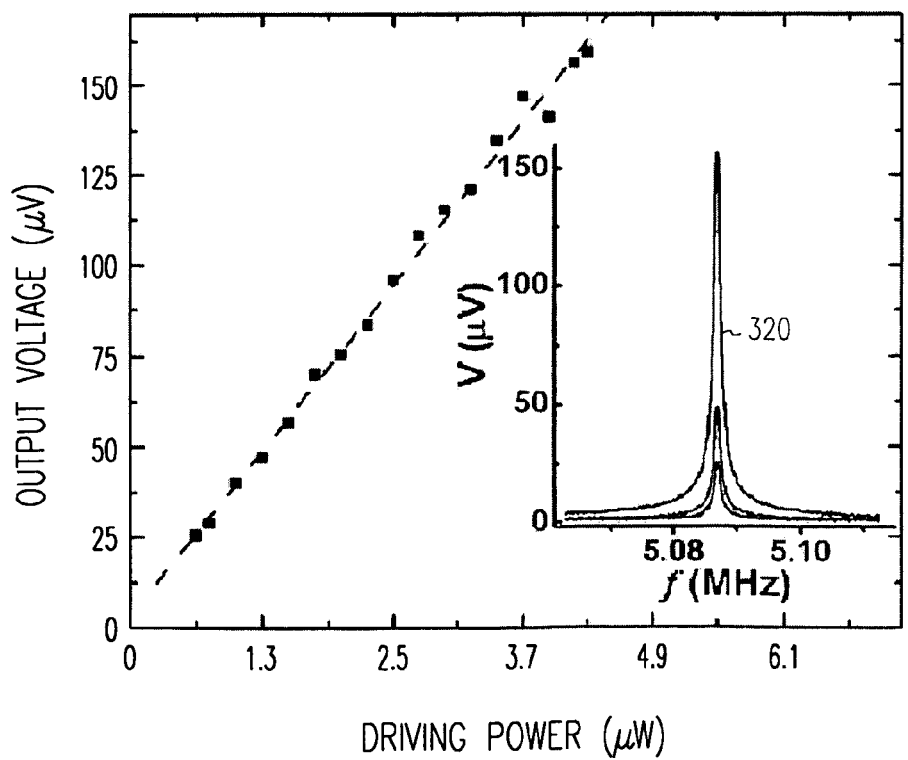
FIG. 3B is a graph illustrating transfer characteristics between a drive signal and a measured photodetector output.

Measurements made on more than 20 individual devices fabricated as described above show that long range optical excitation is reproducible over a large domain of driving signals. FIG. 3B shows linear transfer characteristics over a wide range of excitation signals applied at the base of an 8 μm long $Si_3N_4$ cantilever. The dashed line represents a linear regression fit. Similar measurements, wherein the driving laser position was away from the clamped end, also showed linear transfer characteristics. Within this domain natural frequency of vibration remained constant as indicated at 320. Outside of a linear regime, non-linear characteristics of the resonant devices are observed. In many instances cantilevers of length l>10 μm showed a spectral response indicative of impact phenomenon. At extreme driving amplitudes, impact induced stiction of the oscillator to the underlying substrate layer may occur. One reason for this phenomenon could be that surface contamination residing on the substrate, through impact generated heating, acts as an intermediate bonding layer between the device and substrate layers.

In order to describe the driving mechanism and estimate the level of temperature necessary for the actuation, the device behavior was modeled using both analytical and numerical approaches. The first group of models addresses the problem of the heat transfer within the multilayer structure. It is assumed that the thermal material properties are independent of temperature, thermal contact between layers is perfect at the interfaces and the finite speed of heat propagation can be neglected. At the upper surface of the device layer, along with the Gaussian power density distribution, the source was considered with constant thermal flux within the spot area $r=r_0$ and zero elsewhere. In both cases, a total power of 1 mW was ensured. Additionally, constant surface adsorption and zero absorption depth are assumed.

The material properties used for the calculations are listed in a Table I, shown in FIG. 4, where, E is the Young modulus, α is the coefficient of thermal expansion and ν is the Poisson ratio.

The response of the device-sacrificial layers stack on the semi-infinite Si substrate to the steady and steady-periodic heating was analyzed under the assumption of axisymmetric geometry. The solution is obtained by applying the complex temperature technique. The temperature within each of $i^{th}$ layers is sought as a sum of steady and periodic components $T_i(r,t)=T_i^0(r)+Re[T_i(r)e^{i\omega t}]$. The heat transfer equation in terms of periodic component of temperature takes the shape of Helmholtz pseudowave equation:

$$\frac{1}{r}\frac{\partial}{\partial r}\left(\frac{r \partial T_i(r, z, t)}{\partial r}\right) + \frac{\partial^2 T_i(r, z, t)}{\partial z^2} + \sigma^2 T_i(r, z) = 0 \quad (2)$$

where $\sigma=(1-i)(\omega/2k_i)^{1/2}$ and $k_i=\kappa_i/(\rho_i c_i)$ is thermal diffusivity transform was used in order to reduce the system Eq. (2) to the set of algebraic equations. The inversion was performed numerically and temperature as well as phase shift were calculated.

Steady and transient behavior was modeled using a Finite Element method as well. Modeling construct was based on an axisymmetric triangular element with additional mid-edge nodes. Results of steady state, FIGS. 5A (silicon nitride device layer) and 5B (single crystal silicon device layer) and steady-periodic solutions show that induced radial heat flux arises from the alternating low and high thermal conductivity of sacrificial and device layers respectively. The effectiveness of this "heat channel" mainly depends on the ratio of the thermal conductivity between the layers. In contrast to Si, temperature distribution in the $Si_3N_4$ device layer was more localized with the flux directed toward the substrate. Increase in the excitation frequency leads to a more localized distribution while the difference between Si and $Si_3N_4$ becomes less pronounced.

Figure 5C:
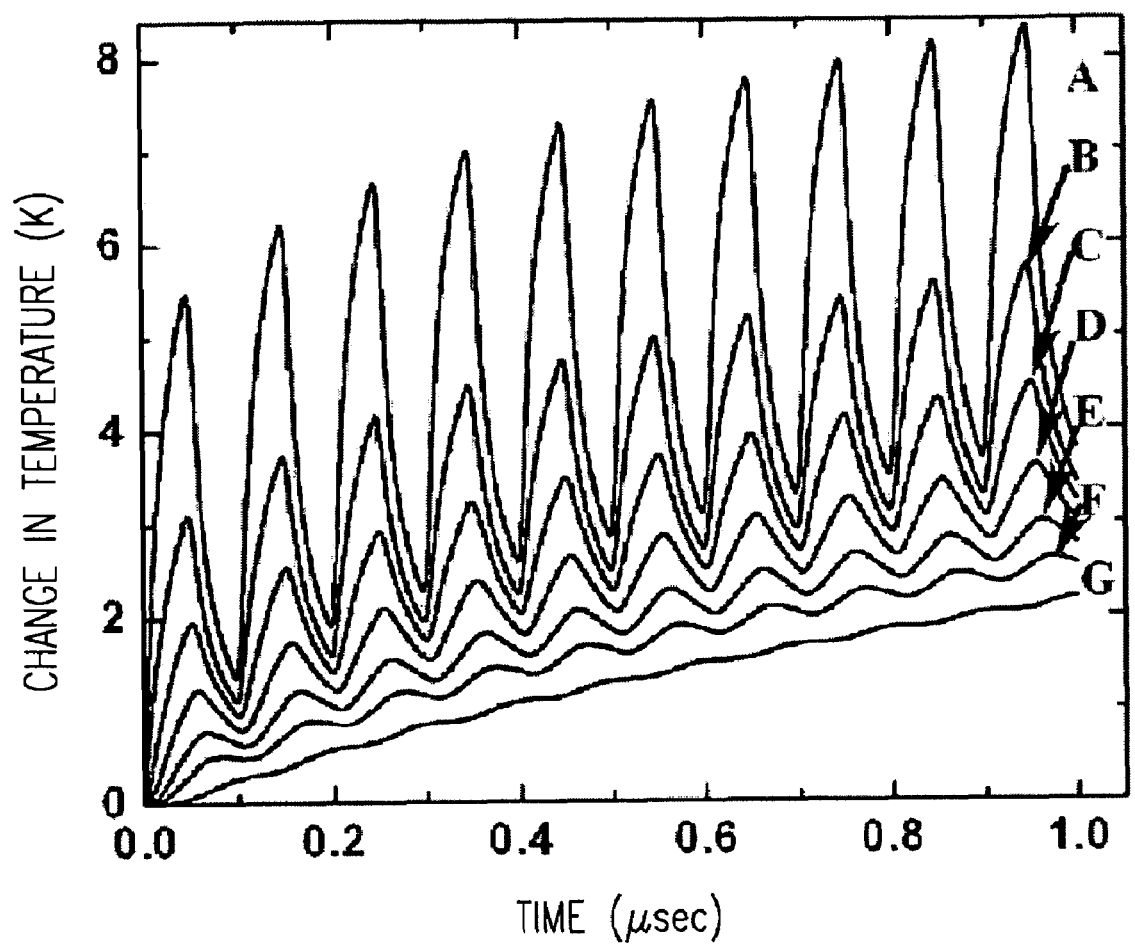
FIG. 5C illustrates a transient response to a 10 MHz square wave signal at the surface of a silicon device layer.

The transient response to the 10 MHz square wave shaped signal excitation applied at t=0 shown in FIG. 5C is composed of a slowly varying and a fast periodic components. The lines correspond to distances, x, of A(x=0.05 μm), B(x=1.55 μm), C(x=2.00 μm), D(x=2.50 μm), E(x=3.03 μm), F(x=3.60 μm) and G(x=5.50 μm). The amplitude of both signals decreases while the shape significantly varies with the distance from the irradiated spot. Comparison between responses of Si and $Si_3N_4$ layers shows qualitatively similar behavior, however, due to a lower κ, the magnitude of the temperature variation is significantly diminished in $Si_3N_4$. Comparison of the accurate one dimensional and numerical transient solution for two layers (2 μm thick $SiO_2$ layer and a semi-infinite Si substrate) and for a laser spot radius equal to computational domain radius R=$r_0$ was performed in order to verify numerical model. The accurate solution was modified to reflect a thermal flux square wave signal $q=q_0 \Sigma_{m=0}^{\infty} (-1)^m H(t-m\tau)$ where τ is half period of the signal and H(t) is the Heaviside's step function.

Solutions of the thermal problem showed that in the case of 1 mW absorbed power, the fast scale temperature variations at a distance of several μm were of the order of several degrees in the case of Si layer and below one degree for $Si_3N_4$. In order to estimate the temperatures required for the actuation of the cantilevers, the deformation of the beam under thermal stresses was studied using Finite Elements method. Due to the difference in the thermal expansion coefficients of the $SiO_2$ and both device layers, in the vicinity of the interface, compressive and tensile thermal stresses arise in the device and sacrificial layers respectively.

Consequently, this results in a stress free released portion of the device layer, while partial deformation takes place at the edge of the $SiO_2$ layer. The actuation appears to take place when the gradient of temperature through the thickness of the device layer is close to zero. Zero gradient is typical for thin NEMS due to the fact that for a typical excitation pulse of τ=50 ns, the thermal diffusion length $(4k_i\tau/\rho_i c_i)^{1/2}$ of both Si and $Si_3N_4$ layers is equal to 4.3 μm and 1.2 μm respectively. These values are significantly greater than the actual thickness of the device layers.

Calculations show that the static deflection angle of the cantilever is ~5 μrad for ΔT=1K. This angle corresponds to the end deflection of $0.5 \times 10^{-4}$ μm for l=10 μm cantilever. Nevertheless, under resonant excitation in vacuum and for Q-factors of the order of $10^4$, the vibration amplitude can reach values comparable with the $SiO_2$ layer thickness, hence confirming the possibility of impact stiction. Alternatively, the periodic component of temperatures necessary for the excitation of the registerable resonant amplitudes of the cantilever is of the order of 0.1° C. and less and can be achieved at the distances of tens of microns from the laser spot.

Characteristics of long range (>160 μm) optical excitation of nanomechanical cantilevers was investigated. It was found that both experimentally measured and modeled dependence of the vibrational amplitude with distance from the source varies as a first order exponential. The origin of this response is attributed to thermal effects. High energy, short duration laser pulses can lead to the excitation of acoustic traveling waves, however, in this case, the combination of relatively low source energy (~$10^2$ μW), long period of sinusoidal excitation (50-300 ns) and signal propagation velocities of the order of 50-200 m/s consistently obtained in model and experiment using the phase shift measurements, suggests that the driving mechanism may be primarily thermal while acoustic wave related phenomena are minor.

Conclusion

Optical or heat actuation of electromechanical single crystal silicon and low stress silicon nitride cantilevers may be accomplished at large distances from a clamped end of the cantilevers. This capability enables a mechanism for simultaneous actuation of arrays of high frequency oscillators with dimensions much less than the diffraction limit of the excitation pulse. The actuation mechanism provides a viable method for optically exciting high frequency nanomechanical structures of dimensions much less than the driving laser diffraction limit. An array of cantilevers having varying resonant frequencies allows selective driving of the cantilevers by varying the frequency of the optical or heat excitation to match the resonant frequency of the desired cantilever or group of cantilevers. While the oscillator has been mainly described as a cantilever, other types of microelectromechanical and nanoelectromechanical resonators, such as doubly clamped beams, plates, and dome resonators may be used.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:
1. A method comprising:
modulating temperature of a portion of a device having a microelectromechanical oscillator formed from a device layer supported by a support layer; and
wherein temperature modulation creates oscillation of the oscillator; and wherein the oscillator is spaced apart from the portion of the device having its temperature modulated.

2. The method of claim 1 wherein the temperature modulation causes a temperature difference between the device layer and support layer to create oscillation of the oscillator.

3. The method of claim 1, wherein the oscillator is spaced apart a distance approximately greater than 50 um.

4. The method of claim 1 wherein the oscillator is selected from the group consisting of cantilever, doubly clamped beam, plate, paddle, and dome resonators.

5. The method of claim 1 wherein the microelectromechanical oscillator includes nanoelectromechanical oscillators.

6. The method of claim 1 wherein the heating is provided by a laser focused on the temperature modulated portion of the device.

7. The method of claim 1 wherein the heating is provided by a resistive heater thermally coupled to the temperature modulated portion of the device.

8. The method of claim 1 wherein multiple resonators are oscillating in response to the temperature modulated portion of the device.

9. The method of claim 1 wherein the support layer comprises a sacrificial layer.

10. A device comprising:
   a device layer;
   a second layer coupled to the device layer;
   a heat source thermally coupled to a remote portion of the device layer; and
   a resonator physically coupled to the device layer such that heating of the remote portion of the device layer causes movement of the resonator; and
   wherein the heat source comprises a heat modulated area of the device layer spaced apart from the resonator.

11. The device of claim 10 and further comprising a laser for heating the heat source.

12. The device of claim 10 wherein the heat source and resonator are spaced apart at least approximately 160 um.

13. The device of claim 10 wherein the heat source comprises a resistor.

14. The device of claim 10 wherein the device layer and second layer have relative high and low thermal conductivities.

15. The device of claim 10 wherein the oscillator is thermally isolated from the heat source.

16. The device of claim 10 wherein the resonator is selected from the group consisting of cantilever, doubly clamped beam, plate, paddle, and dome resonators.

17. The device of claim 10 wherein the resonator comprises a microelectromechanical oscillator or nanoelectromechanical oscillator.

18. The device of claim 10 and further comprising multiple resonators, selected resonators have different resonant frequencies, enabling selective driving of such resonators to oscillation via heating the remote portion of the device layer with selected frequencies of heating.

19. A device comprising:
   a device layer supported by substrate, and having an oscillator;
   means for heating a portion of the device layer remote from the oscillator; and
   means for creating thermal stress to oscillate the oscillator.

20. The device of claim 19 wherein the device layer has multiple oscillators that move in response to the means for heating a portion of the device layer.

* * * * *